United States Patent
Behammer et al.

(10) Patent No.: US 7,573,122 B2
(45) Date of Patent: Aug. 11, 2009

(54) METHOD FOR PRODUCING A SEMICONDUCTOR COMPONENT HAVING A METALLIC CONTROL ELECTRODE, AND SEMICONDUCTOR COMPONENT

(75) Inventors: Dag Behammer, Ulm (DE); Michael Peter Ilgen, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 294 days.

(21) Appl. No.: 11/605,020

(22) Filed: Nov. 28, 2006

(65) Prior Publication Data

US 2007/0218642 A1 Sep. 20, 2007

(30) Foreign Application Priority Data

Mar. 17, 2006 (DE) .................. 10 2006 012 369

(51) Int. Cl.
*H01L 29/12* (2006.01)
(52) U.S. Cl. ..................... 257/613; 438/378
(58) Field of Classification Search ................ 257/279, 257/613, 631, E33.024; 438/378
See application file for complete search history.

(56) References Cited

U.S. PATENT DOCUMENTS

| 6,274,893 | B1 * | 8/2001 | Igarashi et al. | 257/192 |
| 6,307,245 | B1 * | 10/2001 | Kunii et al. | 257/471 |
| 6,686,616 | B1 * | 2/2004 | Allen et al. | 257/280 |
| 7,041,541 | B2 | 5/2006 | Behammer | |
| 7,129,182 | B2 * | 10/2006 | Brask et al. | 438/745 |
| 2003/0075719 | A1 * | 4/2003 | Sriram | 257/77 |

FOREIGN PATENT DOCUMENTS

DE 10304722 8/2004

* cited by examiner

*Primary Examiner*—Thao P. Le
(74) *Attorney, Agent, or Firm*—Collard & Roe, P.C.

(57) ABSTRACT

A method for producing a semiconductor component, and a semiconductor component, having a metallic gate electrode deposited onto a semiconductor layer, with the gate electrode having a gate foot and a gate head. The component is produced by depositing a first layer of aluminum on the semiconductor layer, depositing a second layer of a second metal on the first layer, depositing at least one additional layer (G3) of an additional metal, different from the second metal, on the second layer, and carrying out a temperature treatment at elevated temperature.

13 Claims, 2 Drawing Sheets

Fig. 1a
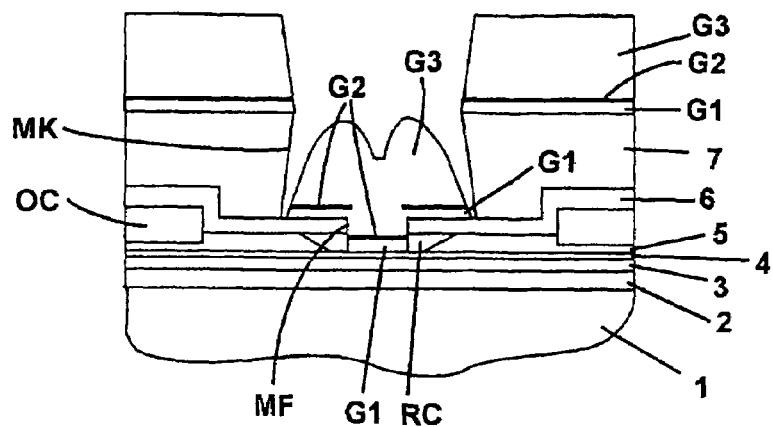
Fig. 1b
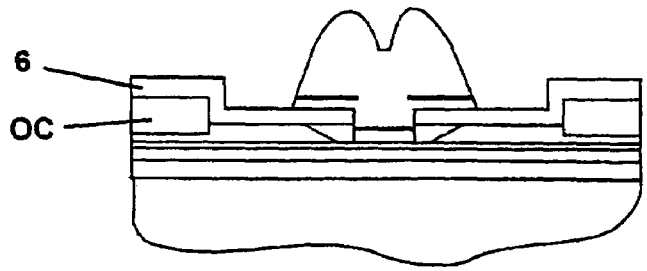
Fig. 1c
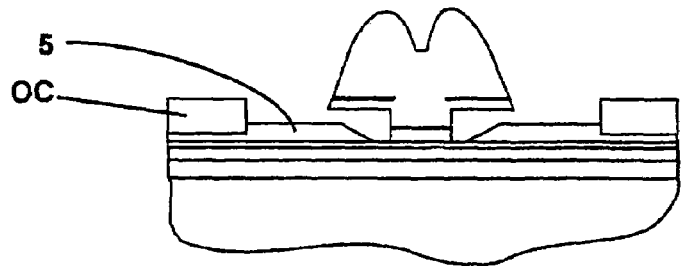
Fig. 1d
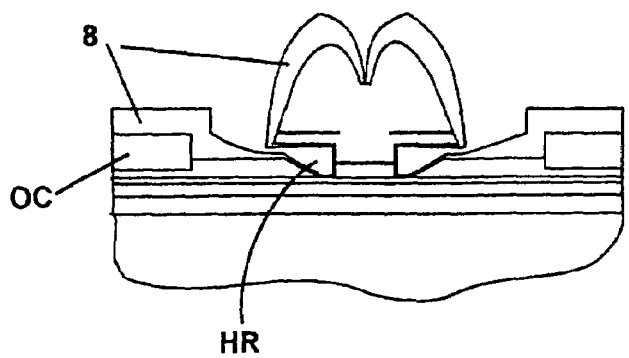
Fig. 1

METHOD FOR PRODUCING A SEMICONDUCTOR COMPONENT HAVING A METALLIC CONTROL ELECTRODE, AND SEMICONDUCTOR COMPONENT

BACKGROUND OF THE INVENTION

1. Field of the Invention

The invention relates to a method for producing a semiconductor component having a metallic control electrode, and to a semiconductor component having a metallic control electrode. The metallic control electrode as a gate electrode of a field effect transistor has a narrower gate foot, and a broader gate head, and is typically approximately T-shaped.

2. The Prior Art

In the case of monolithically integrated circuits having field effect transistors, particularly HEMT high-performance field effect transistors, the gate length of the gate as a control electrode is of particular importance. The precise production of very small gate lengths below 300 nm is critical. The material combination of metal of the control electrode and of the semiconductor material is of essential significance on the basis of alloy formation, diffusion, chemical reaction and influence on the semiconductor properties. Frequently, electrode metals that are suitable on Si substrates are not suitable for compound semiconductor materials, particularly GaAs and InP, and vice versa.

Particularly in the case of components on a GaAs substrate, aluminum is advantageous as a gate material, as compared with Ti/Pt/Au control electrodes that are frequently used.

Aluminum possesses particularly great conductivity and forms a connection with the semiconductor material that is particularly stable in the long term, without impairing the properties of the material by means of diffusion.

A control electrode made of aluminum is described in German Patent No. DE 103 04 722 A1, in which aluminum is deposited over the entire area and the gate head is produced by means of subsequent marking and etching from the continuous metal layer. In another lift-off technique that is frequently used, a structure for a gate head is predetermined in a mask. It is advantageous if the gate foot and the gate head are aligned with one another in a self-adjusting manner.

After deposition of the gate metal, at least one temperature treatment at elevated temperature is required. However, it has been shown that with decreasing gate length, the field effect transistors having an Al gate tend to exhibit NOPO (NO Pinch Off) errors, making the components unusable for many applications.

SUMMARY OF THE INVENTION

It is therefore an object of the present invention to provide a method for producing a semiconductor component and a semiconductor element on a III-V compound semiconductor substrate, which possesses advantageous properties, and is stable in the long term, even at a small gate length.

This object is achieved according to the invention by a method for producing a semiconductor component having a metallic gate electrode deposited onto a semiconductor layer, with a gate foot and a gate head. After deposition of the metal of the gate electrode, a temperature treatment at elevated temperature is carried out, and a first layer (G1) of the gate electrode, of aluminum, is produced on the semiconductor layer, a second layer (G2) of a second metal is deposited on the first layer (G1), which metal limits the growth of the grain sizes of the aluminum in the first layer (G1) during the subsequent heat treatment, and additional metal, different from the second metal, is deposited on the second layer in at least one additional layer (G3).

In the case of the invention, the advantageous properties of the contact between aluminum (Al) as the material of a first layer of the gate foot, and the compound semiconductor material of the semiconductor layer, particularly on GaAs substrate, are maintained. In this connection, unless indicated otherwise, the semiconductor layer is that semiconductor layer on which the control electrode is structured and disposed. The control electrode can, in particular, form a Schottky diode with the semiconductor layer. By means of inserting a second layer of a different metal, it is advantageously possible to avoid the NOPO errors even at very small gate lengths, and to achieve advantageous properties of the field effect transistor that are stable in the long term.

The invention takes advantage of the recognition that an essential reason for the occurrence of the stated NOPO errors is a grain size growth of the aluminum that occurs during the temperature treatment and/or in operation, due to electromigration. A larger grain size in aluminum as the gate metal is actually advantageous for low electrical resistance of the gate control electrode. However, it has been shown that with a decreasing gate length, a larger grain size has a disadvantageous effect in the narrow gate foot.

This disadvantageous phenomenon is counteracted, according to the invention, in that aluminum, with its advantageous physical properties, is used as the gate metal in a thin, first layer, having a first layer thickness, and the grain size growth in the first layer is limited to smaller average grain sizes than in the case of a gate consisting entirely of aluminum, by means of a second layer of a second metal, different from aluminum.

For the second layer, it is advantageous if a metal is selected that can be alloyed with the aluminum of the first layer, and is alloyed with the Al of the first layer at the layer border between the first and second layer, during a temperature treatment that is carried out after deposition of the metal of the gate electrode, preferably at approximately 400° C. It is advantageous if the alloy layer that results from this is at a sufficient distance from the semiconductor layer to avoid impairments of the properties of the metal-semiconductor transition.

It is advantageous if platinum (Pt), nickel (Ni), or preferably titanium (Ti) is deposited onto the first layer as the second metal in the second layer. It is advantageous if the second layer thickness is less than 10 nm, particularly less than 5 nm, preferably less than 2.5 nm.

It is advantageous if additional gate metal that is different from the metal of the second layer is deposited in at least one additional layer. It is advantageous if the gate head consists at least predominantly of the additional metal. The additional metal is preferably deposited in a layer thickness that is greater than the sum of the first and second layer thickness.

It is advantageous if aluminum is used as the additional metal. This prevents the other metal from diffusing from the additional layer through the thin second layer, in the direction of the first layer and the semiconductor layer, and thereby prevents a detrimental influence on the component properties. It is advantageous if the average grain size of the aluminum in the first layer, after the temperature treatment, is smaller than in the additional layer, and preferably amounts to less than 50%, particularly less than 20% of the average grain size in the additional layer.

The deposition of the gate metal preferably takes place by means of vapor deposition. It is advantageous if the structuring of the gate head takes place in a self-adjusting manner relative to the gate foot. The greatest expanse of the gate head in the direction of the gate length preferably amounts to at least 1.5 times the gate length, and can typically amount to as much as approximately 600 nm. It is advantageous if the greatest expanse of the gate head in the direction of the gate length is at least 100 nm greater than the gate length. The gate length can be reduced to as much as approximately 20 nm.

It is advantageous if the gate foot is deposited in a recess channel of the semiconductor surface, for which purpose an opening having the structure of the gate and lateral under-etching is produced in a layer deposited on the semiconductor material. It is advantageous if the layer thickness of the first layer amounts to at least 50%, particularly at least 65%, preferably at least 75% of the depth of the recess channel, thereby making it possible to prevent or limit disadvantageous effects, particularly when using Ti as the second metal, caused by different vapor deposition behavior of the Ti.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIGS. 1a-1d show a process sequence according to the invention, in several steps.

DETAILED DESCRIPTION OF THE PREFERRED EMBODIMENT

Figure 2:
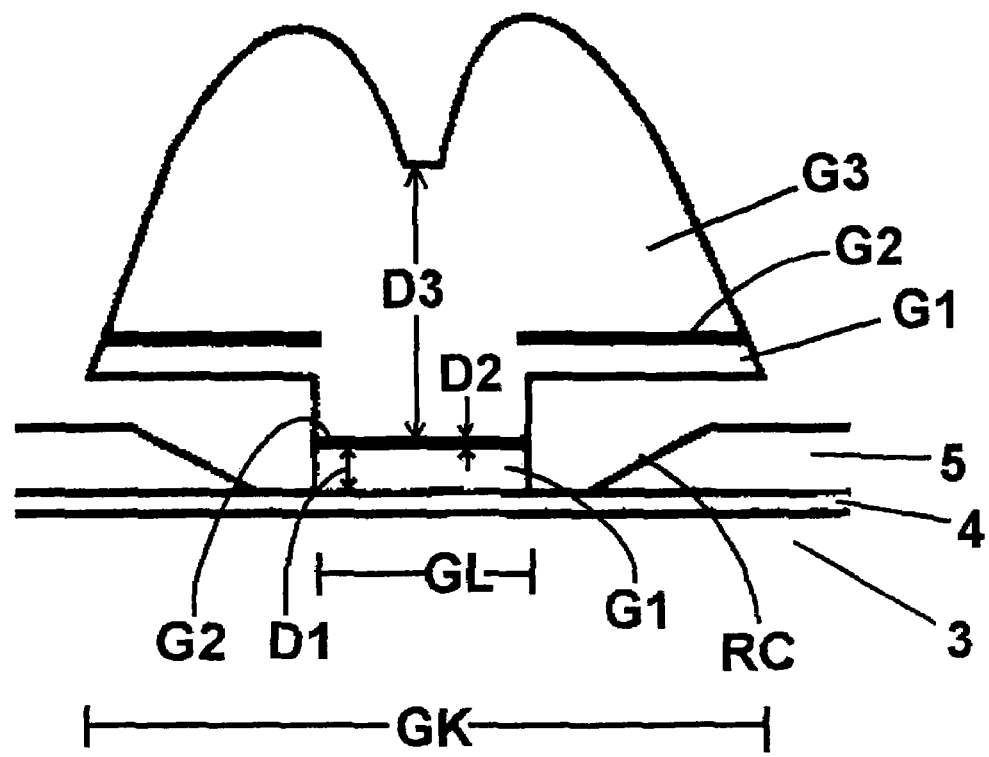
FIG. 2 shows an enlarged detail from FIG. 1d.

Referring now in detail to the drawings, different process stages for the production of a control electrode are sketched in FIG. 1a to 1d. Proceeding from a GaAs substrate 1, layers 2 to 5 form the vertical profile of a field effect transistor. A great number of examples are known for the layer sequence, from the state of the art. The number of layers, the layer thickness values, and the composition of the materials can vary in an individual case.

Typically, layer 2 represents a buffer layer, layer 3 forms a semiconductor layer with the two-dimensional electron gas (the channel), layer 4 is a barrier layer and forms the semiconductor layer on which the metal of the control electrode is deposited, and which forms a Schottky diode with the control electrode, and layer 5 is a highly doped contact layer for low-ohm resistive component contacting by way of ohmic contacts OC. Layer 4, in particular, can have a stop layer as an etch stop for etching processes during the course of production of the component, in its layer border that lies on top, i.e. facing away from the substrate.

Layer 5 preferably consists of GaAs and, if applicable, additional stop layers consist of AlAs or InGaP, for example.

After production of layer sequence 2 to 5 on substrate 1, and production of the ohmic contacts OC, a protective layer 6, for example made of silicon dioxide and/or silicon nitride, is deposited over the whole area.

A layer of photoresist or similar material is deposited on protective layer 6, and the gate structure is produced in it by way of photolithography. With structured layer 7 as a mask, an opening MF is produced in protective layer 6, which opening determines the structure of the gate foot. An opening MK in photoresist layer 7 determines the structure of the gate head of the control electrode. Opening MF in protective layer 6 and opening MK in photoresist layer 7 can be produced by means of separate photolithography steps, or with only a single photolithography step, in self-adjusting manner. The recess channel RC that extends on both sides of the opening MF is produced by means of opening MF in protective layer 6, with lateral under-etching of protective layer 6 into contact layer 5. In this connection, the depth of the recess channel corresponds to the layer thickness of contact layer 5. The gate metal is deposited onto barrier layer 4 by means of cathode sputtering or preferably by means of vapor deposition, through opening MF, and onto protective layer 6 through opening MK, whereby an approximately T-shaped electrode having a narrower gate foot and a broader gate head is formed. The deposited gate metal is also deposited onto the photoresist layer in the surroundings of the gate head, and can be removed from there in a lift-off method, in advantageous manner.

The method described up to this point is fundamentally known from the state of the art, in a great number of variants. Instead of the lift-off method, structuring of the gate head from a continuous metal layer by means of etching can also be performed, as is also known from the prior art cited in the introduction to the specification.

In the case of deposition of the gate metal according to a preferred embodiment of the present invention, a first layer G1 of Al, on this a second layer G2 of Pt, Ni, or preferably Ti, and then again, another layer G3 of Al on this are deposited, one after the other. In the case of structuring of the gate head by means of etching a continuous metal layer, Ti is also preferred because of its better etchability.

After complete deposition of the gate metal according to FIG. 1a, the metal deposited on the photoresist layer 7 is removed by means of lift-off with dissolution of the latter, and the structure according to FIG. 1b is formed. In this situation, a first temperature treatment at elevated temperature, for example at approximately 400° C., is typically carried out. Within the framework of this temperature treatment, grain size growth of the aluminum occurs in layers G1 and G3. The grain size growth in the layer G1 is limited to smaller grain sizes than in the layer G3, because of the measures taken according to the present invention, particularly the restriction of the layer thickness D1 (FIG. 2) of the layer G1.

Afterwards, the protective layer 6 is removed, and the component structure exposed in FIG. 1c is coated with a passivation layer 8 according to FIG. 1d. The application of this passivation layer to a component surface is known.

The present invention essentially relates to the layer structure of the metallic gate electrode of a first layer G1 on the semiconductor material of the semiconductor layer 4 in the recess channel RC, a second layer G2 on the first layer, and another layer G3 on the second layer G2, as shown in the example. The layer sequence is found both in the gate foot above the semiconductor material in the recess channel, and in the gate head above the protective layer to the side of the opening MF. The proportions of the individual layers and/or the control electrode in the figures are not to be understood as being strictly to scale.

The layer G1 consists of aluminum, which forms a boundary surface to the material of the semiconductor layer 4, in particularly advantageous manner, and can form a Schottky diode with it, in particular. The layer 1 is deposited at a layer thickness D1, which is advantageously not greater than 1.5 times the gate length GL, particularly not greater than the gate length GL of the control electrode, see FIG. 2. The layer G1 is also found to the side of the opening MF and within the opening MK on the upper surface of the protective layer 6, with a width GK of the gate head parallel to the direction of the gate length.

It is advantageous if the gate length GL lies below 300 nm, particularly in a range between 20 nm and 300 nm. The width GK of the gate head is greater than the gate length GL and preferably amounts to at least 1.5 times the gate length GL. It is advantageous if the width GK of the gate head lies between 400 nm and 650 nm.

The thickness D1 of the first layer G1 perpendicular to the plane of the semiconductor layer advantageously lies between 10 nm and 100 nm. Particularly with the preferred use of Ti as the metal of a second layer deposited on the first layer, the layer thickness D1 of the first layer advantageously amounts to at least 50%, particularly at least 65%, preferably at least 75% of the depth of the recess channel RC under the protective layer 6. The depth of the recess channel is at least approximately equal to the layer thickness of the contact layer 5. Penetration of Ti, vapor-deposited with great divergence, into the recess channel is avoided or can be kept low by means of a slight distance between the upper layer border of the first layer and the opening MF in the protective layer 6. The first layer can also reach all the way into the opening MF.

A second layer G2 of a second metal (or metal mixture) is deposited onto the first layer G1 through the opening MF and through the opening MK. The second metal is different from aluminum and advantageously possesses the property of being able to form an alloy with aluminum, and of limiting the grain size growth of aluminum in the layer G1, during subsequent heat treatment or due to electromigration during operation. Pt, Ni, or, in particular, Ti are suitable, for example. A restriction of the grain size growth occurs, in particular, due to the fact that grains in the aluminum layer G1 grow in all directions at the same time, and that a stop in the grain size growth at the layer border from G1 to G2 essentially brings about a stop in the grain size growth transverse to the layer border plane. Therefore, a low layer thickness of the layer G1 is of particular significance.

The second layer thickness D2 of the second layer G2 is advantageously less than 10 nm, particularly less than 5 nm, preferably less than 2.5 nm. Additional gate metal in at least one additional layer, preferably precisely one additional layer G3 is deposited on the second layer G2. The deposition of the additional gate metal in the layer G3 takes place in a layer thickness D3 that is advantageously greater than the sum of the first layer thickness and second layer thickness, G1 and G2. It is advantageous if the gate head consists predominantly of the additional gate metal in the additional layer G3.

It is advantageous if the additional layer G3 consists of aluminum as the additional gate metal. This advantageously has a very low specific electrical resistance.

Grain size growth occurs also in the aluminum of the additional layer G3 as a result of the subsequent temperature treatment, advantageously at about 400° C., and/or during operation of the component, due to electromigration. Here, however, no measures are required or provided to limit the grain size growth. Larger grain sizes can be advantageous with regard to the electrical resistance of the gate thread, which stands perpendicular to the plane of the drawing. It is advantageous that after the temperature treatment, an average grain size of the aluminum occurs in the first layer G1 that is less than the average grain size of the aluminum in the additional layer G3, and advantageously less than 50%, particularly less than 20% of the average grain size of the aluminum in the additional layer G3.

During the temperature treatment, alloy formation of the various metals also occurs at the border surfaces of the second layer G2 to the first layer G1 and the third layer G3. An alloy zone that forms in the first layer advantageously does not reach all the way to the semiconductor layer 4, and is at a sufficient distance from layer 4, so that the properties of the Schottky transition between the first layer G1 of the control electrode and the semiconductor layer 4 are not impaired by the alloy.

The characteristics indicated above and in the claims as well as evident from the figures can be advantageously implemented both individually and in various combinations. The invention is not limited to the exemplary embodiments described, but rather can be modified in many different ways, within the scope of the abilities of a person skilled in the art. In particular, with regard to the composition of the semiconductor layers, different variants are familiar to a person skilled in the art as being equivalent, and, in particular, an InP substrate can also be provided instead of a GaAs substrate.

Accordingly, while only a few embodiments of the present invention have been shown and described, it is obvious that many changes and modifications may be made thereunto without departing from the spirit and scope of the invention.

What is claimed is:

1. A semiconductor component having a metallic gate electrode on a semiconductor layer of semiconductor material on GaAs substrate, said gate electrode having a gate foot and a gate head and consisting of several layers when viewed in a direction perpendicular to a plane of the semiconductor layer, said layers comprising: a first layer (G1) consisting of aluminum and having a first layer thickness (D1) ;a second layer (G2) on top of the first layer (G1) and consisting of a second metal, different from aluminum; and at least one additional layer (G3) formed above the second layer and consisting of an additional metal, different from the metal of the second layer, wherein the additional layer consists mostly or entirely of aluminum, and wherein an average grain size of the aluminum in the first layer is less than an average grain size of the aluminum in the additional layer.

2. A semiconductor element according to claim 1, wherein the first layer thickness (D1) is not greater than 1.5times a length of the gate.

3. A semiconductor element according to claim 1, wherein the first layer thickness (D1) is between 10 nm and 100 nm.

4. A semiconductor element according to claim 1, wherein the gate foot is disposed in a recess channel.

5. A semiconductor element according to claim 4, wherein the first layer thickness (D1) amounts to at least 50% of a depth of the recess channel.

6. A semiconductor element according to claim 1, wherein the metal of the second layer forms an alloy with the Al of the first layer at a border surface between the first and second layers.

7. A semiconductor element according to claim 6, wherein the alloy is disposed at a distance from the semiconductor layer.

8. A semiconductor element according to claim 6, wherein the second layer contains Ti, Ni, or Pt.

9. A semiconductor element according to claim 1, wherein the second layer (G2) has a layer thickness (D2) that is less than the first layer thickness (D1).

10. A semiconductor element according to claim 9, wherein the second layer thickness (D2) is less than 10 nm.

11. A semiconductor element according to claim 1, wherein the gate head is formed mostly by the additional layer (G3).

12. A semiconductor element according to claim 9, wherein a layer thickness (D3) of the additional layer (G3) is greater than a sum of the layer thicknesses of the first and second layers (D1, D2).

13. A semiconductor element according to claim 1, wherein the average grain size of the aluminum in the first layer amounts to less than 50% of the average grain size in the additional layer.

* * * * *